United States Patent
Kettner et al.

(10) Patent No.: US 11,744,301 B2
(45) Date of Patent: Sep. 5, 2023

(54) GLOVE HAVING ELECTRONIC COMPONENTS AND A FLEXIBLE PRINTED CIRCUIT BOARD

(71) Applicant: Workaround GmbH, Munich (DE)

(72) Inventors: Michael Kettner, Munich (DE); Ritika Swami, Munich (DE)

(73) Assignee: WORKAROUND GMBH, Munich (DE)

( * ) Notice: Subject to any disclaimer, the term of this patent is extended or adjusted under 35 U.S.C. 154(b) by 142 days.

(21) Appl. No.: 17/150,981

(22) Filed: Jan. 15, 2021

(65) Prior Publication Data

US 2021/0219639 A1  Jul. 22, 2021

(30) Foreign Application Priority Data

Jan. 16, 2020  (DE) ..................... 10 2020 100 985.2

(51) Int. Cl.
*A41D 19/00* (2006.01)
*G06K 7/10* (2006.01)
*H05K 1/02* (2006.01)

(52) U.S. Cl.
CPC ..... *A41D 19/0027* (2013.01); *A41D 19/0024* (2013.01); *G06K 7/10891* (2013.01); *H05K 1/0265* (2013.01)

(58) Field of Classification Search
CPC ........... G06K 7/10396; G06K 7/10891; G06K 19/07762; G06K 2007/10534; G06F 3/014; A41D 19/0024; A41D 19/002; H05K 1/0265
USPC .................................................. 235/462.44
See application file for complete search history.

(56) References Cited

U.S. PATENT DOCUMENTS

| | | | |
|---|---|---|---|
| 5,365,213 A | 11/1994 | Paull et al. | |
| 9,900,061 B1* | 2/2018 | Lui | G06K 19/07762 |
| 10,064,276 B2 | 8/2018 | Williams | |
| 2007/0146127 A1* | 6/2007 | Stilp | G08B 1/08 |
| | | | 340/539.1 |
| 2013/0197720 A1 | 8/2013 | Kraimer et al. | |
| 2015/0070162 A1 | 3/2015 | Vorhies et al. | |
| 2016/0161301 A1* | 6/2016 | Guenther | A61B 5/6825 |
| | | | 702/150 |
| 2017/0338610 A1* | 11/2017 | Brunnbauer | A41D 19/0024 |

(Continued)

FOREIGN PATENT DOCUMENTS

DE  102016109117 A1  11/2017
EP    3208687 A1   8/2017

*Primary Examiner* — Suezu Ellis
(74) *Attorney, Agent, or Firm* — Dilworth IP, LLC (57) ABSTRACT

A glove having a palm section, a dorsal section and an electrical device including at least one first component, one second component and a signal line. The first component is provided on the dorsal section and the second component is provided on a section of the glove that is different to the dorsal section. The signal line connects the components to each other electrically and includes a flexible printed circuit board with at least one conductor. The third component is provided on the palm section, on the dorsal section or on a lateral section of the glove, and the second component is provided at the location of the glove that rests on the index finger or the metacarpophalangeal joint of the index finger of a user's hand in the worn condition of the glove. The conductor is designed redundantly. A system including a glove and a functional unit.

20 Claims, 5 Drawing Sheets

(56) References Cited

U.S. PATENT DOCUMENTS

2019/0213363 A1* 7/2019 Sugiura ................ G06K 7/0017
2020/0305522 A1* 10/2020 Ruhland ................. G06F 3/014

* cited by examiner

GLOVE HAVING ELECTRONIC COMPONENTS AND A FLEXIBLE PRINTED CIRCUIT BOARD

FIELD OF THE DISCLOSURE

The present disclosure relates to a glove comprising an electrical device as well as a system comprising a glove and at least a functional unit.

BACKGROUND

Gloves, on which electrical devices are provided, are well-known. To increase user acceptance, however, the components of the electrical device must not be particularly large in order to not impede the user's actions, the movement of the fingers and/or the entire hand. This reduces the construction volume available for electrical devices which in turn results in limited functionalities.

SUMMARY

Thus, there is a need to provide a glove comprising an electrical device as well as a system comprising such a glove, said system having an increased construction volume and being reliable and durable.

For this purpose, a glove, in particular a work glove, is provided, the glove comprising a palm section covering the palm, a dorsal section covering the dorsum of the hand and an electrical device that has at least a first component, a second component and a signal line. The first component is provided on the dorsal section and the second component is provided on a section of the glove that is different to the dorsal section, wherein a signal line connects the components to each other electrically and comprises a flexible printed circuit board with at least one conductor. The at least one conductor of the signal line is designed redundantly.

By distributing the components of the electrical device to different areas of the glove, the construction volume available for the electrical device can be increased considerably.

By using a signal line with a flexible printed circuit board, cable breakage that occurs upon excessive movement can be avoided reliably, thereby increasing durability despite the distribution of the electrical device to several components spaced apart.

Flexible printed circuit boards are also normally termed "flex PCBs". Thus, the signal line may also be designed as a flex PCB. As least parts of one, several or all components may be formed together with the flexible printed circuit board as a rigid-flex PCB.

In particular, the second component is provided at the location of the glove that rests on the index finger and/or the metacarpophalangeal joint of the index finger of a user's hand in the worn condition of the glove.

In doing so, the actions of the user are not impeded as the radial side of the index finger as well as the palm of the hand are not usually used or only rarely used for a few actions.

The location, on which the second component is attached, is in particular on the radial side of the index finger or the metacarpophalangeal joint.

For example, the electrical device comprises at least one third component, wherein the signal line electrically connects said at least one third component to at least the first and/or the second component and wherein said at least one third component is provided on the dorsal section and/or on a section of the glove different from the dorsal section, in particular wherein said at least one third component is provided on the palm section and/or on a lateral section of the glove. In this way, a complex electrical device can also be realized on the glove.

In the worn condition, the lateral section is preferably on a side of the user's hand, e.g., on the edge, on the index finger and/or on the metacarpophalangeal joint of the index finger of the user's hand.

Of course, in the case of several third components, the different third components may be provided on different sections of the glove.

Moreover, the object is solved by means of a glove, in particular a work glove comprising a palm section covering the palm, a dorsal section covering the dorsum of the hand and an electrical device comprising at least a first component, a second component and at least a third component. The first component is provided on the dorsal section and said at least a third component is provided on the palm section, on the dorsal section and/or on a lateral section of the glove. The second component is provided at the location of the glove that rests on the index finger and/or the metacarpophalangeal joint of the index finger of a user's hand in the worn condition of the glove.

For example, the electrical device has a signal line, wherein the signal line electrically connects the components to each other and comprises in particular a flexible printed circuit board with at least one conductor. The at least one conductor of the signal line may be designed redundantly.

In an embodiment of the disclosure, the signal line comprises two, four, six or more conductors, thereby connecting the components reliably and efficiently. For example, a bus system may be realized via the signal line.

A conductor, for example, is to be regarded as an artery of the signal line, i.e. a connection of components that is electrically separate from the other arteries.

To design the signal line efficiently, the signal line may comprise a first line section, which extends from the first component, and a second line section, which extends to the third component, in particular wherein the first line section and the second line section comprise a varying number of conductors.

For example, the first line section connects the first and second components electrically to each other. The second line section may connect the third component to the first and/or the second component.

The signal line may comprise branching, from which another line section runs to the second component.

In an embodiment design, the signal line runs substantially, in particular exactly, parallel to the traverse direction of the palm section at the transition from dorsal section to palm section, thereby improving durability.

To improve the service life further, each conductor has a network of auxiliary conductors.

A receiving space, in which the third component is located, is formed on the palm section, in particular between two layers of material of the palm section, for the purpose of secure and comfortable attachment.

The receiving space may be closed or may be provided with an opening to the exterior. The opening is provided in particular on the side facing the body.

The third component and/or the receiving space may have a volume of less than 30 cm$^3$, particularly less than 20 cm$^3$ in order to not impact on wearing comfort.

Alternatively or additionally, the third component and/or the receiving space have a volume of more than 0.5 cm$^3$, particularly more than 5 cm$^3$, thereby providing enough construction space for the components.

The embodiment design with a volume of less than 30 cm³ or 20 cm³ and/or more than 0.5 cm³ or 5 cm³ is particularly advantageous in cases, in which the third component and the receiving space are provided on the palm section.

The volume of the receiving space is to be regarded in particular as the maximum volume of the receiving space.

To improve the ergonomics of the glove further, the third component and/or the receiving space may comprise a principal direction, wherein the principal direction runs substantially parallel to a finger-side edge of the palm section and/or substantially parallel to the traverse direction of the palm section.

Substantially parallel means, for example, an angle of less than 30°, particularly less than 15°.

In an embodiment, the first component and/or the third component is an electronic module and/or has a holder for a separate functional unit, in particular wherein the electronic module is or comprises a battery, an accumulator, a sensor unit, a trigger, a rigid printed circuit board, a microprocessor and/or a system on a chip. In this way, a versatile and powerful system can be worn on the body by means of the glove.

System on a chip is also known as SoC.

For reliable operation, the holder may have at least one electrical contact element for contacting the relevant functional unit, wherein the contact element is connected to the signal line.

In an embodiment design of the disclosure, the second component is a trigger device and/or a sensor device in order to enable simpler operation.

For example, the glove has a band-like base body that comprises the palm section, the dorsal section as well as optionally a thumb hole, thereby making the glove versatilely applicable, even enabling it to be worn over other gloves.

For example, the base body does not have any fingers or finger appendages.

In an embodiment design, the second component is provided at least for the most part on a tongue of the base body that protrudes on the finger side beyond a finger-side edge of the palm section and/or an imaginary extension of the finger-side edge of the palm section, thereby enabling the base body to be designed particularly small or narrowly.

For example, the finger-side edge of the palm section runs in the worn condition of the glove on the wrist side from at least the metacarpophalangeal joint of the index finger, thereby ensuring the movement of the finger is hindered even less by the glove.

The object is also solved by a system comprising a glove, as previously described, and at least one functional unit that is separate from the glove, said functional unit being attached detachably to the glove and electrically connected to the electrical device, in particular wherein said at least one separate functional unit is attached in a holder of the glove.

The features and advantages described for the glove equally apply to the system and vice versa.

BRIEF DESCRIPTION OF THE DRAWINGS

Additional advantages and features of the disclosure can be found in the following description as well as in the attached drawings to which reference is made. In the drawings.

DETAILED DESCRIPTION

Lists having a plurality of alternatives connected by "and/or", for example "A, B and/or C" are to be understood to disclose an arbitrary combination of the alternatives, i.e. the lists are to be read as "A and/or B and/or C". The same holds true for listings with more than two items.

Figure 1:
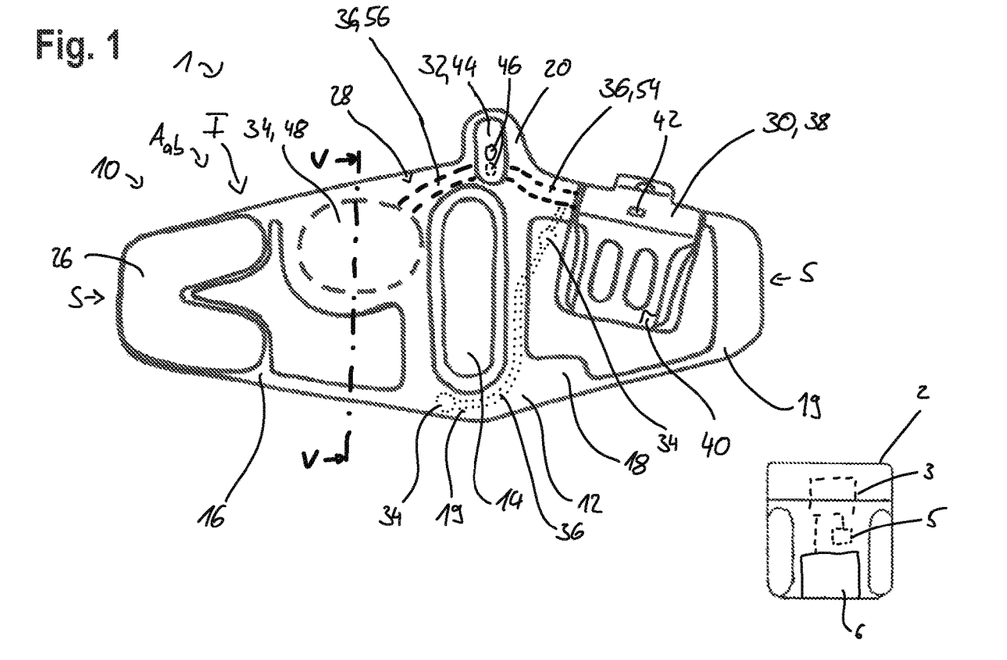
FIG. 1 shows a top view of the side facing away from the body of a system according to the disclosure comprising a glove according to the disclosure and a separate functional unit.
Figure 2:
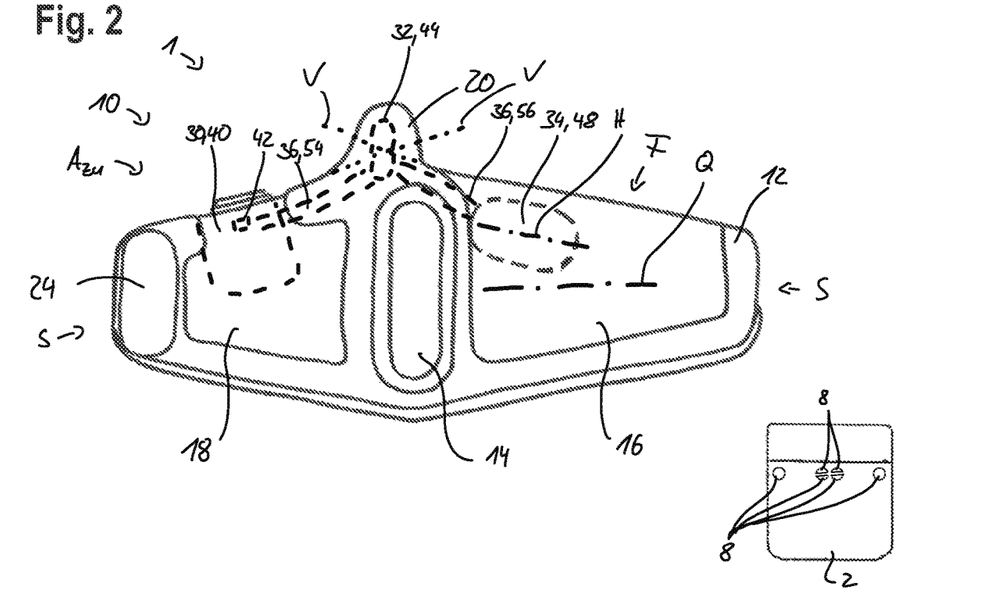
FIG. 2 shows the system according to FIG. 1 in a top view on the side facing the body.

In the FIGS. 1 and 2, a system is shown comprising a glove 10 and a functional unit 2 that is separate from the glove 10, wherein the functional unit 2 is attachable to the glove 10.

The system 1 comprising glove 10 and functional unit 2 is what is termed a "wearable".

The functional unit 2 is for example a unit with a sensor 3, such as a barcode scanner, and/or a communication device 5 for wireless communication with other devices, such as a computer for data processing.

The communication device 5 is formed, for example, for the purpose of communicating by means of the Bluetooth protocol and/or WLAN protocol.

Alternatively or additionally, the functional unit 2 may have a display 6.

On its bottom side, the functional unit 2 has at least two mating contacts 8, with which the functional unit 2, more specifically the sensor 3, the communication device 5 and/or the display 6 may be contacted and be integrated into a circuit.

In the shown situations, the glove 10 is not being worn and is lying spread out on a surface.

The glove 10 is for example a work glove, for example for workers on an assembly line or employees in a logistics centre.

The glove 10 has a band-like base body 12 that is, for example, elastic.

The band-like base body 12 comprises two short end edges S and two longer longitudinal edges, wherein the longitudinal edge that faces the user's fingers when the glove 10 is worn correctly is referred to as the finger-side edge F. The opposing longitudinal edge is then facing the wrist and thus termed the wrist-side edge.

Similarly, the base body 12 has a side $A_{ab}$ facing away from the body and a side $A_{zu}$ facing the body, wherein in the case of the glove 10 being worn correctly the side $A_{zu}$ facing the body rests on the hand or on a user's glove worn underneath.

In the case of the glove 10 being worn correctly, the side $A_{ab}$ facing away from the body can be seen in FIG. 1 and the side $A_{zu}$ facing the body can be seen in FIG. 2.

Fingers or appendages for fingers are not provided on the base body 12

The glove 10 of the embodiment shown is not a full glove with fingers, but rather a glove which only covers the dorsum and the palm of a user's hand provided that it is being worn correctly. The glove 10 is thus similar to a covering or a bandage that only surrounds parts of the hand and does not need to be pulled over the hand, but rather is closed around the hand.

In the base body 12, a thumb hole 14 is provided which has a rectangular shape with semi-circular segments attached in the shown embodiment and which can extend over almost the entire width of the base body 12, thus almost from the wrist-side edge H to the finger-side edge F.

The base body 12 also has a palm section 16 and a dorsal section 18, which are separated from each other by the thumb hole 14. Moreover, the base body 12 has at least one lateral section 19, for example between the palm section 16 and the dorsal section 18 and/or on the end edges S of the base body 12.

If the glove 10 is being worn correctly, the palm section 16 is located on the palm of the user's hand and the dorsal section 18 is located on the dorsum of the user's hand and covers it. The lateral sections 19 are located on the edge of the hand, on the index finger and on metacarpophalangeal joint of the index finger and cover these respectively (cf. FIGS. 6 and 7).

The palm section 16 covers then the palm of the user's hand for the most part and the dorsal section covers the dorsum of the user's hand for the most part.

The palm section 16 and the base body 12 and thus the glove 10 have a traverse direction that runs in the worn condition of the glove 10 traverse to the fingers when extended. This direction of the glove 10 and the palm section 16 is thus referred to as the traverse direction Q of the hand hereinafter.

The finger-side edge F of the palm section 16 runs in the worn condition of the glove 10 on the wrist side from at least the metacarpophalangeal joint of the user's index finger.

In FIG. 1, the palm section 16 is located left of the thumb hole 14. The dorsal section 18 is bipartite, wherein one part of the dorsal section 18 is located left of the palm section 16 and the other part is located right of the thumb hole 14.

The base body 12 also has a tongue 20. The tongue 20 extends beyond the finger-side edges F of the palm section 16 and the dorsal section 18, thus on the finger side beyond the finger-side edge F of the palm section 16 and also the dorsal section 18, more specifically beyond an imaginary extension V of the finger-side edges F of the palm section 16 and the dorsal section 18.

For example, the extensions V of the finger-side edges F form an angle $\alpha$ in the range from 110° to 160°.

In the shown embodiment, the tongue 20 protrudes beyond the finger-side edge F of the dorsal section 18 to a lesser extent than beyond the finger-side edge F of the palm section 16.

Moreover, a first fastening element 24 is attached to the dorsal section 18 on the side $A_{zu}$ of the base body 12 facing the body that is indicated by dashed lines in FIG. 1.

The first fastening element 24 is located, for example, close to the end edge S.

Similarly, a second fastening element 26 is attached to the left dorsal section 18 on the end edge S, but on the sides $A_{ab}$ facing away from the body, said second fastening element 26 working with the first fastening element 24 when the glove 10 is worn correctly so that the base body 12 and the entire glove 10 can be fixed into position on the user's hand. The first and the second fastening elements 24, 26 may form, for example, a Velcro fastening.

It is of course also conceivable that the first fastening element 24 is provided on the side $A_{ab}$ facing away from the body and the second fastening element 26 is provided on the side $A_{zu}$ facing the body.

Moreover, it is conceivable that a gap or another opening is provided close to one of the end edges S, through said gap or opening the opposite end edge S and parts of the base body 12 can be pulled. The part of the base body 12 pulled through the gap may then be fastened to the part of the base body 12 not pulled through, for example by means of a Velcro fastening, in order to fasten the glove 10 onto the user's hand.

The glove 10 also comprises an electrical device 28 that has at least three components, namely a first component 30, a second component 32 and at least a third component 34 as well as signal line 36.

The electrical device 28 is connected to the base body 12 permanently and thus an integral part of the glove 10.

In other words, the electrical device 28 cannot be detached from the base body 12 without destroying the base body 12.

For example, the signal line 36 as well as one or several of the components 30, 32, 34 are located between two layers of the base body 12 and/or adhered to the base body 12.

The second component 32 is provided on glove 10 in an area that rests on the index finger and/or on the metacarpophalangeal joint of the index finger on the user's hand in the worn condition of the glove 10.

In the shown embodiment, this area is for example the tongue 20, on which the second component 32 is located.

The first component 30 is provided on the dorsal section 18 in this case and the third component 34 is provided on the palm section 16.

Additional third components 34 can also be provided, for example, on one or several of the lateral sections 19 and/or the dorsal section 18. In FIG. 1, such additional third components 34 are indicated by dotted lines.

For example, the first component 30 is a holder 38 for the separate functional unit 2.

The holder 38 comprises a retainer 40, in which the functional unit 2 is insertable, and at least one electrical contact element 42.

The holder 38 is located on the side $A_{ab}$ of the dorsal section 18 facing away from the body, in particular adhered to the base body 12 there.

The holder 38, for example, is adjacent to the finger-side edge F or protrudes beyond this.

The functional unit 2 may be attached to the glove 10 by means of the holder 38, wherein in this case the functional unit 2 is received in the retainer 40 and is contacted by the electrical contact element 42 and the mating contacts 8.

The second component 32 is a trigger device 44 in the shown embodiment. The trigger device 44 has for example a switch 46, such as a pushbutton switch or a capacitive switch.

It is also conceivable that the trigger device 44 has several switches 46.

The trigger device 44 is located for example on the side $A_{ab}$ facing away from the body on the tongue 20 so that user can easily reach it.

Alternatively or additionally, the second component 32 can have or be a sensor device, i.e. can have a sensor or be a sensor.

The third component 34 comprises an electronic module 48. In the shown embodiment, the third component 34 is an accumulator that is received in the base body 12 entirely.

Alternatively or additionally, the electronic module 48 may comprise a battery, a sensor unit, a trigger, a control element, a rigid printed circuit board, a microprocessor and/or a system on a chip.

It is of course also conceivable that the first component 30 has an electronic module 48 that is or comprises for example a battery, an accumulator, a sensor unit, a trigger, a rigid printed circuit board, a microprocessor and/or a system on a chip.

The third component 34 described in detail is representative of all intended third components 34 that are connected electrically to other components 30, 32, 34 via the signal line 36 in an analogue way.

Of course, the different third components 34 can be of different types, i.e. one of the third components 34 is for example an accumulator, another third component 34 is a microprocessor and an additional third component 34 is a control element, such as a button.

The three components 30, 32, 34 are connected electrically by means of the signal line 36.

Figure 3:
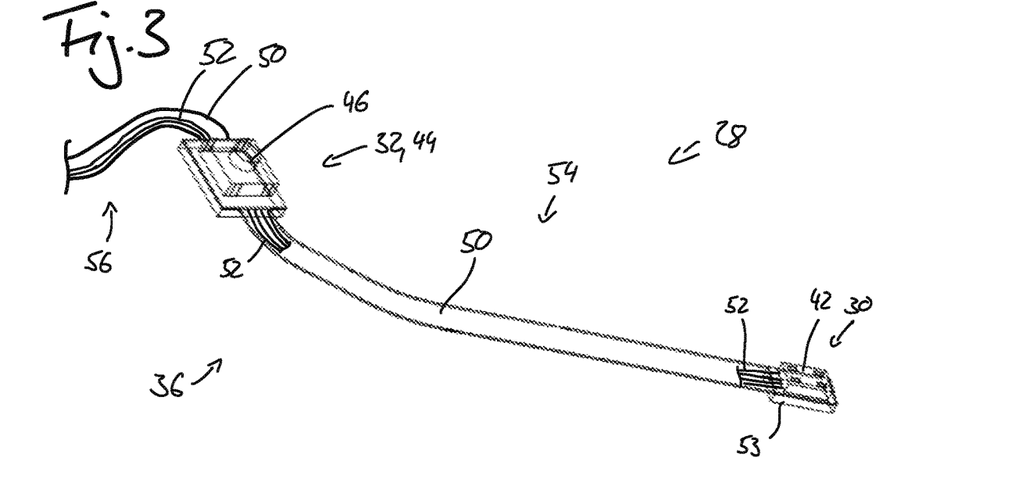
FIG. 3 shows a perspective view of a signal line with connected components of the glove according to FIG. 1.

The signal line 36 is also integrated into the base body 12 completely and is shown in FIG. 3 in a perspective view together with the components 30, 32, 34.

The signal line 36 has at least a flexible printed circuit board 50, on which at least one conductor 52 is formed.

Flexible printed circuit boards are usually also termed "flex PCBs" so that the entire signal line 36 can be regarded as a flex PCB.

The signal line 36 may be amplified at one or more of its ends by means of an amplifier 53 in each case.

It is also conceivable that the signal line 36 is formed as a single piece with one or several components 30, 32, 34. In the two latter cases, the printed circuit board 50 can be formed as a rigid flex PCB.

The signal line 36 comprises a first line section 54 and a second line section 56.

The first line section 54 extends from the first component 30 (of which only the electrical contact element 42 is shown in FIG. 3) to the second component 32.

The second line section 56 of the signal line 36 extends from the second component 32 to the third component 34, which has not been shown in FIG. 3 for the sake of clarity.

The signal line 36 thus extends from the dorsal section 18 to the palm section 16 and runs for example substantially parallel to the traverse direction Q of the glove 10 and the palm section 16 at the transition from the dorsal section 18 to the palm section 16.

The signal line 36 runs for example at least in part, in particular primarily in at least one neutral area of the glove 10 in relation to changes in length upon moving the user's hand or a finger.

It is clearly evident that the signal line 36 comprises four conductors 52 in the first line section 54 and only two conductors 52 in the second line section 56.

In each case, two conductors 52 are used in the shown embodiment to connect the second component 32 and the third component 34 to the first component 30, more specifically to connect in each case the individual contacts of the electronic contact element 42. As a result, the second component 32 and the third component 34 are electrically connected to the functional unit 2.

The signal line 36 thus contacts the electrical contact element 42 of the holder 38 of the first component 30, the trigger device 44 of the second component 32 and the electronic module 48 of the third component 34.

More specifically, electrical contacting is produced by the conductors 52 of the signal line 36.

The signal line 36 comprises four conductors 52 in the shown embodiment, however it is also conceivable that the signal line 36 comprises two, six or more conductors 52.

Different conductors 52 or different pairs of conductors 52 may be arranged on different sides of the printed circuit board 50.

A conductor 52 constitutes an artery of the signal line that constitutes a connection that is electrically separate from the other arteries.

Figure 4:
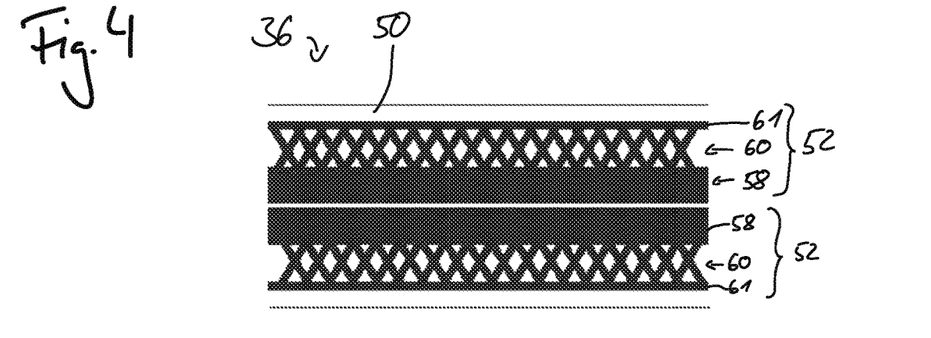
FIG. 4 shows an enlargement of a section of the conductor of the signal line schematically.

In FIG. 4, an enlarged view of two conductors 52 of the signal line 36 are shown as an example.

Each of the conductors 52 comprises a main conductor 58 as well as a network of auxiliary conductors 60 running parallel to the main conductor 58. The network of auxiliary conductors 60 is connected at many points to the main conductor 58 and has many cross connections between the auxiliary conductors 60 so that the conductor 52 as a whole is designed at each point with multiple redundancies.

A secondary conductor 61 of the conductor 52 may also be provided on the side facing away from the main conductor 58.

Figure 5:
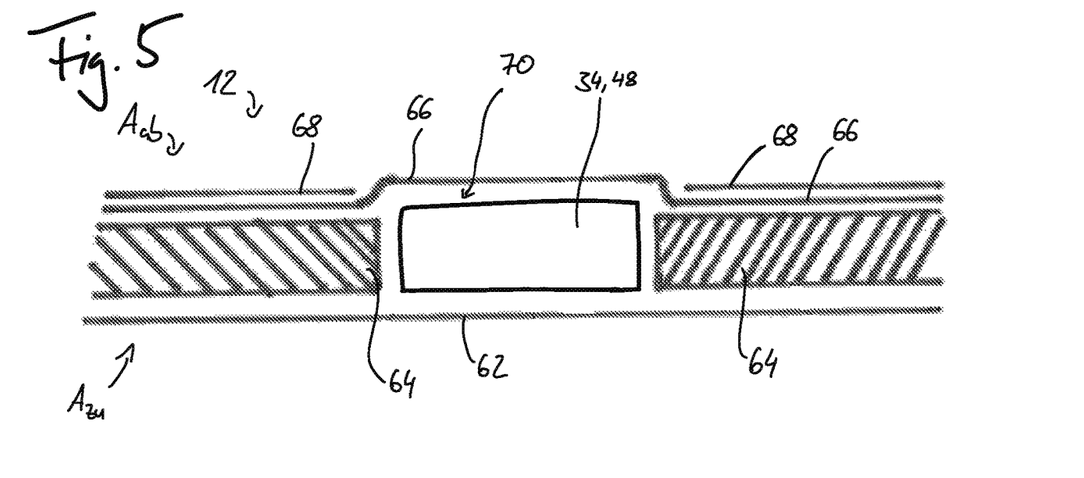
FIG. 5 shows a section through the system according to FIG. 1 along the line V-V.

In FIG. 5, a section is shown through the glove 10 in the area of the third component 34. The base body 12 comprises several material layers 62, 64, 66 that can all be textile layers. Hereinafter, the material layer on the side $A_{zu}$ of the base body 12 facing the body is regarded as the lower material layer 62.

The middle material layer 64 is formed thicker and more elastically than the lower and upper material layers 62, 66 and is provided and attached between the upper material layer 66 and the lower material layer 62.

The middle material layer 64 is discontinuous in the area of the components 30, 32, 34, in particular in the area of the second and third components 32, 24, as can be seen from the example of the third component 34 in FIG. 5.

At these locations, a receiving space 70 is formed between the lower material layer 62 and the upper material layer 66; in said receiving space 70 the respective component 32, 34 is received, thus here the third component 34.

In the shown embodiment, the receiving space 70 is closed to the environment, i.e. the lower material layer 62 and the upper material layer 66 are closed in the area of the receiving space 70.

The receiving space 70 has a volume of more than 0.5 cm³, particularly more than 5 cm³, but less than 30 cm³, particularly less than 20 cm³.

The volume of the receiving space 70 is the maximum volume of the receiving space 70 when the glove is stretched out on a surface.

The receiving space 70 has a principal direction H (FIG. 2) that runs substantially parallel to the finger-side edge F of the palm surface 16. It is also conceivable that the principal direction H runs substantially parallel to the traverse direction Q of the palm section 16.

In this regard, "substantially parallel" is understood to mean that an angle between the principal direction H and the finger-side edge F or the traverse direction Q of the hand is less than 30°, particularly less than 15°.

For example, the angle for a glove 10 of differing size is different. It is conceivable, for example, that the angle is larger, the smaller the glove is in order to exploit the size of the hand optimally.

The principal direction H is understood to mean in this regard the direction of the largest expansion of the receiving space 70.

The third component 34, thus the electronic module 48, has a similar geometry to that of the receiving space 70.

The size of the receiving space 70 and the size of the electronic module 48 are thus matched to each other.

Thus, the third component 34 and the electronic module 48 also have a volume that is larger than 0.5 $cm^3$, particularly larger than 5 $cm^3$, and smaller than 30 $cm^3$, particularly smaller than 20 $cm^3$.

Of course, the volume of the electronic module 48 and the third component 34 is slightly less than the volume of the receiving space 70.

Similarly, the third component 34 and the electronic module 48 have a principal direction H that runs parallel to and in particular congruently with the principal direction H of the receiving space 70.

Thus, the principal direction H of the electronic module 48 and the third component 34 are also substantially parallel to the finger-side edge F and/or the traverse direction Q of the hand.

Figure 6:
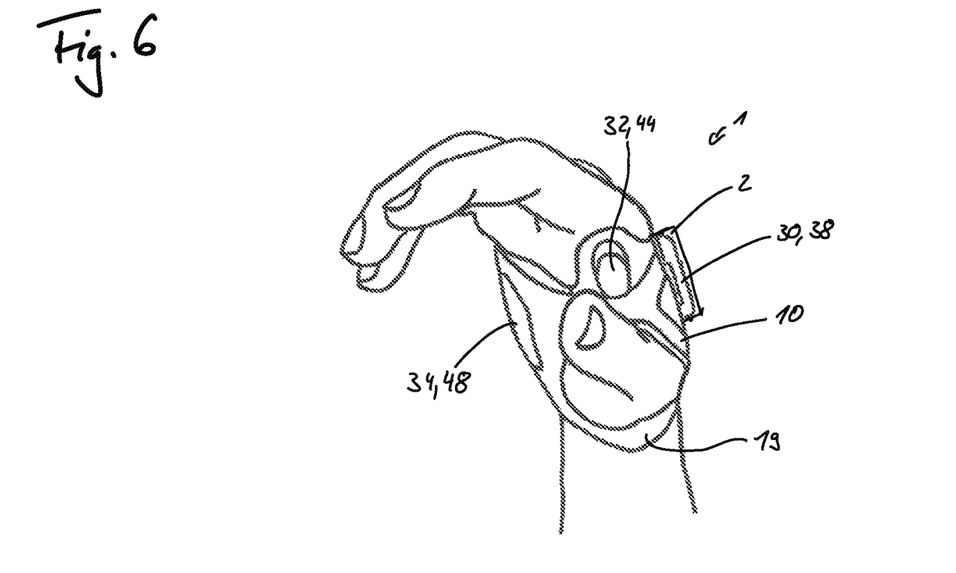
FIG. 6 shows a perspective view of the system according to FIG. 1 in the worn condition on the user's hand.
Figure 7:
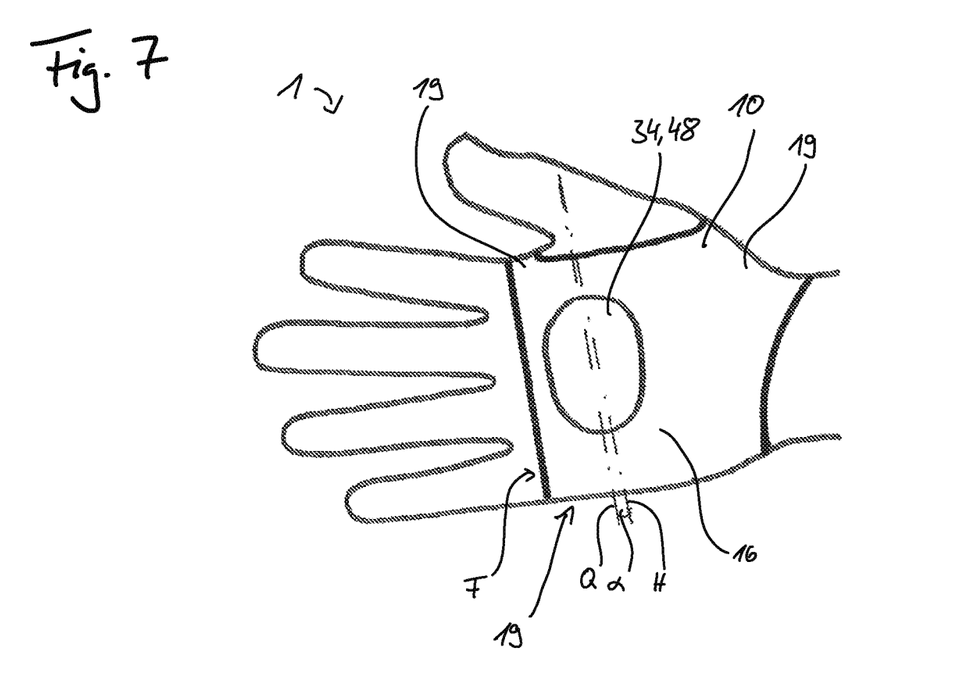
FIG. 7 shows a view of the palm of a user's hand, on which the system according to FIG. 1 is being worn.

In FIGS. 6 and 7, the glove 10 is shown in the worn condition on a right hand.

It is clearly evident that the palm section 16 and the dorsal section 18 rest on the palm and the dorsum of the user's hand.

Moreover, the tongue 20 rests on the radial side of the metacarpophalangeal joint of the user's index finger.

The switch 46 of the trigger device 44 is actuable by the thumb in this position particularly ergonomically.

It is also conceivable that the tongue 20 is slightly longer so that the tongue 20 rests on the radial side of the index finger.

Similarly, it is clearly evident in FIG. 7 that the third component 34 rests in the middle of the palm in an area that hardly moves when closing the hand. Rather, the movement when closing the hand leads to a hollow in this area that receives the third component 34.

Thus, the third component is not perceived to be troublesome by the user.

The dorsal section 18 together with the holder 38, in which the functional unit 2 is inserted, are not visible in FIGS. 6 and 7.

By means of the signal line 36, the functional unit 2, the trigger device 44 and the electronic module 48 are electrically connected together and collectively form a joint system.

For example, the accumulator of the electronic module 48 provides the functional unit 2 with power and the user can actuate the sensor 3, for example the barcode scanner, by actuating the switch 46 of the trigger device 44.

In this way, a comprehensive wearable is provided that is durable and hardly impacts on the user.

In FIGS. 8 to 15, further embodiments of individual aspects of the glove 10 and the system 1 are shown. The embodiments substantially correspond to the first embodiment that is explained by means of the FIGS. 1 to 7. The same parts and parts with the same function are provided with the same reference signs and only the differences are discussed hereinafter.

It is self-evident that aspects of different embodiments may be combined with each other as desired.

In FIGS. 8 to 11, different embodiments of the signal line 36 are shown schematically together with the components 30, 32, 34.

Figure 8:
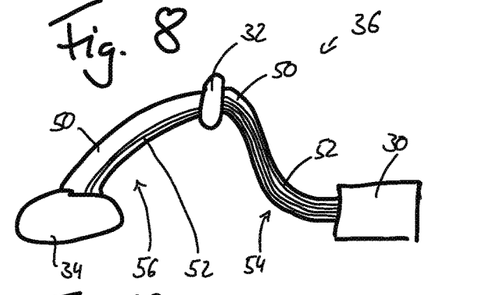
FIGS. 8 to 11 show various embodiments of the signal line of a glove according to the disclosure.

The embodiment of FIG. 8 corresponds to that of the design of FIG. 3 and thus the first embodiment.

Figure 9:
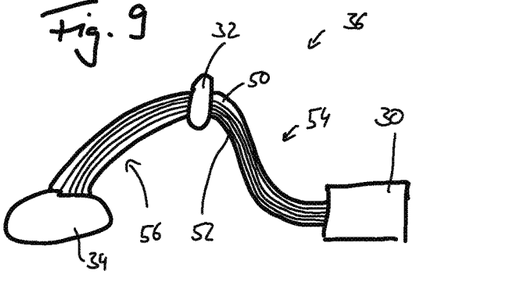

As in the first line section 54, four conductors 52 are also provided in the second line section 56 in the embodiment according to FIG. 9. With this configuration, it is possible to enable the components 30, 32, 34 to communicate with each other by means of a bus system.

Figure 10:
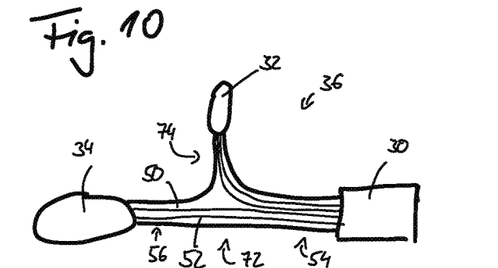

In another embodiment according to FIG. 10, the signal line 36 and the printed circuit board 50 have a branching 72, wherein the first line section 54 extends from the first component 30 to the branching 72 and the second line section 56 extends from the third component 34 to the branching 72.

The second component 32 is connected by means of an additional line section 74 to the branching 72 and thus to the remaining line sections 54, 56.

The second line section 56 thus connects the third component 34 to the first component 30 and the second component 32.

In doing so, the two conductors 52 run through the first line section 54 and the additional line section 74 from the first component 30 to the second component 32. Two further conductors 52 run from the first component 30 through the first line section 54 and the second line section 56 to the third component 34.

Figure 11:
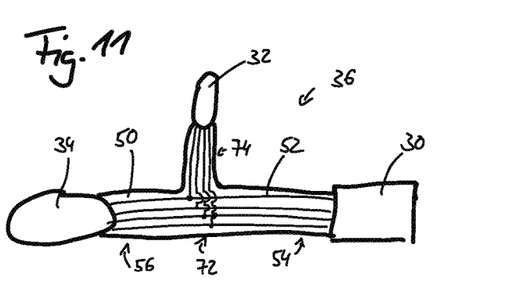

The embodiment according to FIG. 11 corresponds to the construction of FIG. 10 in terms of the construction of the flexible printed circuit board 50, wherein the conductors 52 are formed differently in FIG. 11.

In the embodiment according to FIG. 11, four conductors 52 extend from the first component 30 via the line sections 54, 56 to the third component 34.

The conductors 52 also branch at the branching 72 so that the four conductors 52 also run via the additional line section 74 to the second component 32.

Figure 12:
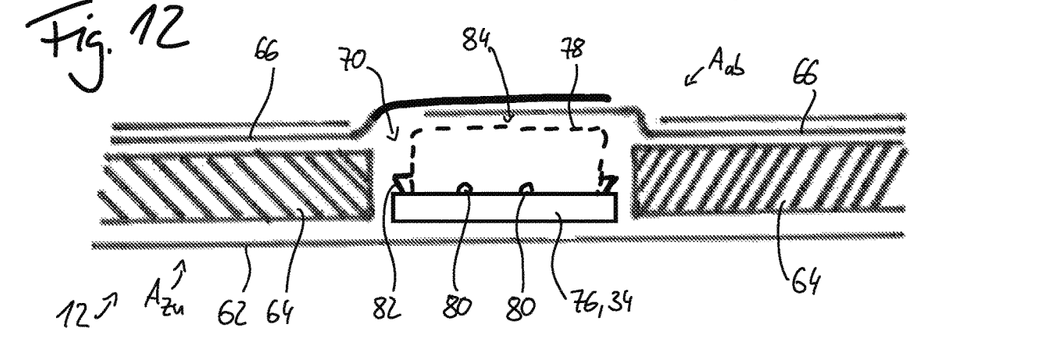
FIG. 12 shows a vertical section similar to that of FIG. 5 through a system according to the disclosure in accordance with a further embodiment.
Figure 13:
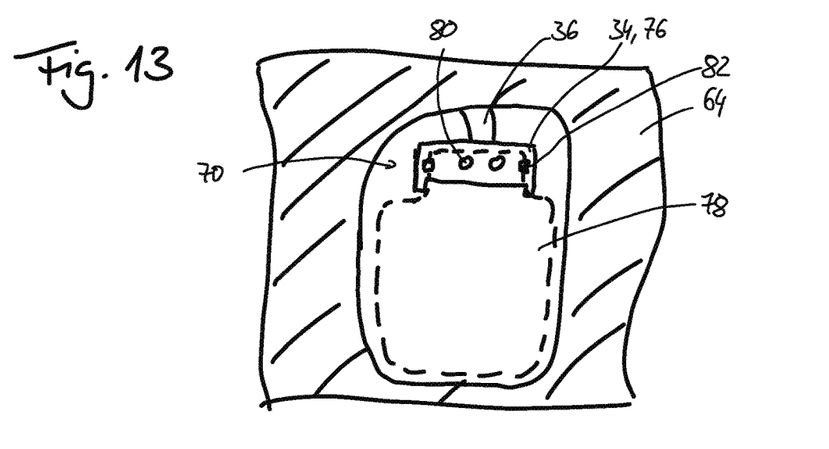
FIG. 13 shows a horizontal section in the area of the section of FIG. 12, and FIGS. 14 and 15 show a further embodiment of a glove according to the disclosure in a view on the dorsal section or the palm section.

In FIGS. 12 and 13, a further embodiment design of the third component 34 as well as the receiving space 70 are shown.

For example, the third component 34 is a holder 76 for an additional separate functional unit 78.

Similar to the holder 38, the holder 76 has several contact elements 80 for contacting the functional unit 78 which are connected to the signal line 36 and the conductors 52.

Similarly, the holder 76 has two holding elements 82 to fix the functional unit 78 into position on the holder 76.

The functional unit 78 may fulfil the same functions as the electronic module 48, with the difference being that the functional unit 78 may be exchanged.

For example, the functional unit 78 is also an accumulator.

It is also conceivable that the functional unit 78 is a sensor unit with a sensor.

In contrast to the first embodiment, the base body 12 has an opening 84 in one of the material layers 62 or 66. The functional unit 78 can be removed from as well as inserted into the receiving space 70 through the opening 84.

In the shown embodiment, the opening 84 is located in the upper material layer 66, i.e. on the side $A_{ab}$ facing away from the body.

It is also conceivable that the opening 84 is located in the lower material layer 62, i.e. on the side $A_{zu}$ facing the body.

The respective material layer 62, 66 is doubled in the area of the opening 84, wherein the doubled sections overlap and thus close the opening 84.

To remove and insert the functional unit 78, the user can grasp between the overlapping sections to pass the functional unit 78 through.

In this way, the functional unit 78 can be changed simply and reliably.

Figure 14:
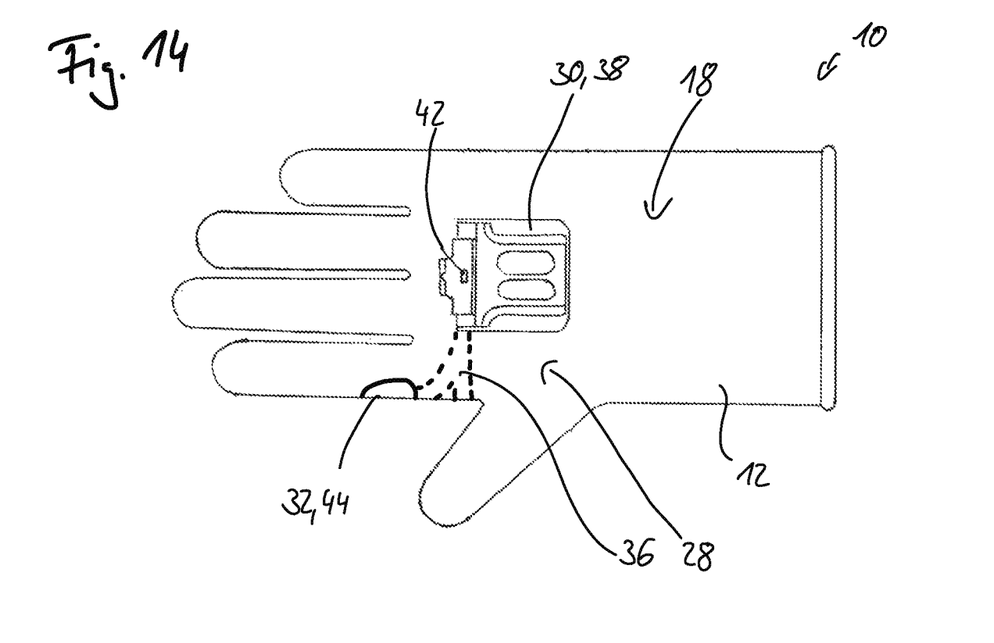
Figure 15:
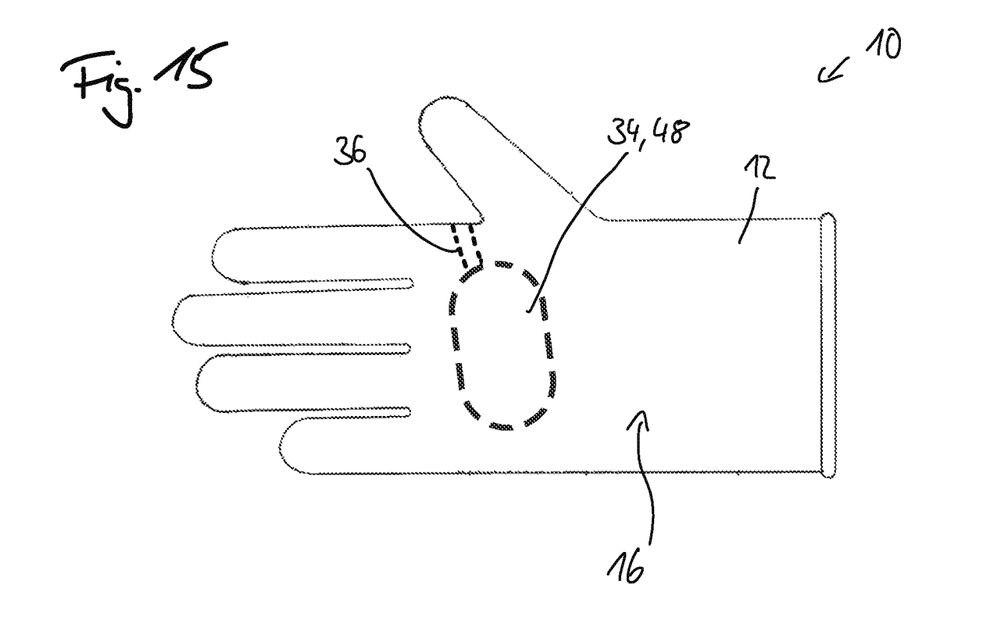

In FIGS. 14 and 15, a further embodiment of the glove 10 is shown, in which the base body 12 is now formed as a full glove with fingers.

The invention claimed is:

1. A glove, comprising a palm section, a dorsal section and an electrical device that has at least a first component, a second component and a signal line,
    wherein the first component is provided on the dorsal section and the second component is provided on a section of the glove that is different to the dorsal section,
    wherein the signal line connects the components to each other electrically and comprises a flexible printed circuit board with at least one conductor, wherein said at least one conductor of the signal line is designed redundantly, wherein the at least one conductor has a network of auxiliary conductors.

2. The glove according to claim 1, wherein the second component is provided at a location of the glove that rests on at least one of an index finger or a metacarpophalangeal joint of an index finger of a user's hand in a worn condition of the glove.

3. The glove according to claim 1, wherein the electrical device comprises at least one third component, wherein the signal line electrically connects said at least one third component to at least one of at least the first or the second component and wherein said at least one third component is provided on at least one of the dorsal section or a section of the glove that is different from the dorsal section.

4. The glove according to claim 3, wherein said at least one third component is provided on at least one of the palm section or a lateral section of the glove.

5. The glove according to claim 3, wherein a receiving space, in which the at least one third component is located, is formed on the palm section.

6. The glove according to claim 5, wherein at least one of the at least one third component or the receiving space comprises a principal direction, wherein the principal direction runs at least one of substantially parallel to a finger-side edge of the palm section or substantially parallel to a traverse direction of the palm section.

7. The glove according to claim 3, wherein at least one of the first component or the at least one third component comprise at least one of an electronic module or a holder for a functional unit, the functional unit being separate from the glove.

8. The glove according to claim 7, wherein the electronic module is or comprises at least one of a battery, an accumulator, a sensor unit, a trigger, a rigid printed circuit board, a microprocessor or a system on a chip.

9. The glove according to claim 7, wherein the first component comprises a holder and an electronic module, the electronic module being a trigger or a control element.

10. The glove according to claim 1, wherein the second component is at least one of a trigger device or a sensor device.

11. The glove according to claim 10, wherein the second component is provided at least partially on a tongue of a base body that protrudes on a finger side beyond at least one of a finger-side edge of the palm section or an imaginary extension of the finger-side edge of the palm section.

12. A glove, comprising a palm section, a dorsal section and an electrical device that has at least a first component, a second component and a signal line,
    wherein the first component is provided on the dorsal section and the second component is provided on a section of the glove that is different to the dorsal section,
    wherein the signal line connects the components to each other electrically and comprises a flexible printed circuit board with at least one conductor, wherein the at least one conductor has a network of auxiliary conductors,
    wherein the first component comprises a holder and an electronic module, the electronic module being a trigger or a control element, and wherein the second component is at least one of a trigger device or a sensor device.

13. The glove according to claim 12, wherein the electrical device comprises at least one third component, wherein the signal line electrically connects said at least one third component to at least one of at least the first or the second component and wherein said at least one third component is provided on at least one of the dorsal section or a section of the glove that is different from the dorsal section.

14. The glove according to claim 13, wherein the at least one conductor of the signal line is designed redundantly.

15. The glove according to claim 13, wherein a receiving space, in which the at least one third component is located, is formed on the palm section.

16. The glove according to claim 15, wherein at least one of the at least one third component or the receiving space comprise a principal direction, wherein the principal direction runs at least one of substantially parallel to a finger-side edge of the palm section or substantially parallel to a traverse direction of the palm section.

17. The glove according to claim 13, wherein the at least one third component comprises at least one of an electronic module or a holder for a functional unit, the functional unit being separate from the glove.

18. The glove according to claim 17, wherein the electronic module of the at least one third component is or comprises at least one of a battery, an accumulator, a sensor unit, a trigger, a rigid printed circuit board, a microprocessor or a system on a chip.

19. The glove according to claim 12, wherein the second component is provided at least partially on a tongue of a base body that protrudes on a side of an index finger beyond at least one of a finger-side edge of the palm section or an imaginary extension of a finger-side edge of the palm section.

20. A system with a glove and at least one functional unit that is separate from the glove, said glove comprising a palm section, a dorsal section and an electrical device that has at least a first component, a second component and a signal line,
    wherein the first component is provided on the dorsal section and the second component is provided on a section of the glove that is different to the dorsal section,
    wherein the signal line connects the components to each other electrically and comprises a flexible printed circuit board with at least one conductor, wherein said at least one conductor of the signal line is designed redundantly,
    said at least one functional unit being detachably attached to the glove and electrically connected to the electrical device, wherein the at least one conductor has a network of auxiliary conductors.

* * * * *